(12) United States Patent
Stanion

(10) Patent No.: US 6,457,162 B1
(45) Date of Patent: Sep. 24, 2002

(54) METHOD AND APPARATUS FOR IMPLICIT VERIFICATION OF DIGITAL CIRCUITS

(75) Inventor: Robert Theodore Stanion, Lake Oswego, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/426,365

(22) Filed: Oct. 25, 1999

(51) Int. Cl.[7] .............................................. G06F 17/50
(52) U.S. Cl. ............................................................ 716/7
(58) Field of Search ........................................ 716/1–21

(56) References Cited

U.S. PATENT DOCUMENTS 5,841,674 A * 11/1998 Johannsen .................... 716/7

* cited by examiner

Primary Examiner—Matthew Smith
Assistant Examiner—Thuan Do
(74) Attorney, Agent, or Firm—Jonathan T. Kaplan; Howrey Simon Arnold & White, LLP

(57) ABSTRACT

In the design of large scale digital integrated circuits, it is often desirable to formally verify whether an implementation design is equivalent to a reference design. The present invention utilizes a particular type of structural similarity between the reference and implementation designs, which we shall refer to as "structural dependence," in order to broaden the class of circuits that are formally verifiable in an efficient manner. Structural dependence is the dependence of the higher-order result bits of a design upon the circuitry driving the lower-order result bits. Structural dependence is utilized in partitioning the two circuits, also referred to as $\eta$ and $\eta'$, to be compared. Such partitioning creates subcircuits $\eta_i$ for circuit $\eta$ and subcircuits $\eta'_i$ for circuit $\eta'$. Each subcircuit $\eta_i$ drives a primary output $z_i$ and each subcircuit $\eta'_i$ drives a primary output $z'_i$.

Implicit verification operates as follows, for example, with respect to verifying the high-order primary output bit of two n bit circuits which have been partitioned according to structural dependency. A condition called C is defined which asserts that the high order primary output bits, $z_{n-1}$ and $z'_{n-1}$, of each of the two circuits being compared, are equivalent. C is defined in terms of the high order subcircuits of $\eta_{n-1}$ and $\eta'_{n-1}$. A condition A is defined which asserts that all the lower-order primary output bits of the two multipliers are equivalent. A is defined in terms of all the remaining subcircuits of $\eta$ and $\eta'$ not utilized in C. The procedure then tries to prove the implication that if A is true then C is true, or mathematically A→C. This is equivalent to showing that A.C̄=0. Once A→C has been proven true, assuming that condition A is known to be true, it is then known by implication that C is true.

13 Claims, 16 Drawing Sheets

1) procedure imp_ver ($\eta, \eta'$) begin
2)     partition each of circuits $\eta$ and $\eta'$;
3)     for $i = 0$ to $n-1$ begin
4)         $g = f_i \oplus f'_i$;
5)         for $j = i-1$ to $0$ begin
6)             $g = g \cdot x'_j \cdot x'_j \cdot \overline{(f_j \oplus f'_j)}$;
7)             if $g = 0$ then break;
8)         end
9)         if $g = 0$ then mark $z_i$ and $z'_i$ as being equivalent;
10)        else mark $z_i$ and $z'_i$ as not being equivalent and break;
11)    end
12)    if all pairs of outputs of $\eta$ and $\eta'$ are equivalent return SUCCESS;
13)    else return indicatror of non-equivalent $z_i$ and $z'_i$ pair;
14) end imp_ver;

FIG. 5

$\eta_0:\ z_0 = f_0 = x_0$
$\quad x_0 = z_0 \odot x_0$ $\eta_1:\ z_1 = f_1 = x_1 x_0$
$\quad x_1 = (z_1 \odot x_1 x_0) \odot (y_1 \odot x_1 x_0)$ $\eta_2:\ z_2 = f_2 = x_2 y_1$
$\quad x_2 = (z_2 \odot x_2 y_1) \odot (y_2 \odot y_1)$ $\eta_3:\ z_3 = f_3 = x_3 x_2 x_2$
$\quad x_3 = z_3 \odot x_3 x_2 y_2$

FIG. 6A $\eta'_0$ : $z'_0 = f'_0 = x_0$
$x'_0 = z'_0 \odot x_0$ $\eta'_1$ : $z'_1 = f'_1 = x_1 x_0$
$x'_1 = (z'_1 \odot x_1 x_0) \odot (y'_1 \odot x_1 x_0)$ $\eta'_2$ : $z'_2 = f'_2 = x_2 y'_1$
$x'_2 = z'_2 \odot x_2 y'_1 \odot (y'_2 \odot x_2 y'_1)$ $\eta'_3$ : $z'_3 = f'_3 = x_3 y'_2$
$x_3 = z'_3 \odot x_3 y'_2$

FIG. 6B

For $i = 0$:
$$g = f_0 \oplus f'_0 = x_0 \oplus x_0 = \emptyset$$

FIG. 6C

For $i = 1$:
$$g = f_1 \oplus f'_1 = x_1 x_0 \oplus x_1 x_0$$

For $j = 0$:
$$g = (x_1 x_0 \oplus x_1 x_0) \cdot$$
$$x_0 \cdot$$
$$x'_0 \cdot$$
$$f_0 \cdot f'_0$$

$$= \emptyset \cdot$$
$$x_0 \cdot$$
$$x'_0 \cdot$$
$$f_0 \odot f'_0$$
$$= \emptyset$$

FIG. 6D

For $i = 2$:
$$g = f_2 \oplus f'_2 = x_2 y_1 \oplus x_2 y'_1$$
$$= x_2(y_1 \oplus y'_1)$$

For $j = 1$:
$$g = x_2(y_1 \oplus y'_1) \cdot$$
$$(z_1 \odot x_1 x_0) \cdot (y_1 \odot x_1 x_0) \cdot$$
$$(z'_1 \odot x_1 x_0) \cdot (y'_1 \odot x_1 x_0) \cdot$$
$$((x_1 x_0) \odot (x_1 x_0))$$
$$= x_2(y_1 \overline{y'_1} + \overline{y_1} y'_1) \cdot$$
$$(z_1 y_1 x_1 x_0 + \overline{z_1}\, \overline{y_1}\, \overline{x_1 x_0}) \cdot$$
$$(z'_1 y'_1 x_1 x_0 + \overline{z'_1}\, \overline{y'_1}\, \overline{x_1 x_0}) \cdot$$
$$1$$
$$= \emptyset$$

FIG. 6E for $i = 3$ :
$$g = f_3 \oplus f'_3 = x_3 x_2 y_2 \oplus x_3 y'_2$$
$$= x_3 (x_2 y_2 \oplus y'_2)$$

for $j = z$ :
$$g = x_3 (x_2 y_2 \oplus y'_2) \cdot$$
$$(z_2 \odot x_2 y_1) \cdot (y_2 \odot y'_1) \cdot$$
$$(z'_2 \odot x_2 y'_1) \cdot (y'_2 \odot x_2 y'_1) \cdot$$
$$(x_2 y_1 \odot x_2 y'_1)$$
$$=$$
$$x_3 \cdot (x_2 y_2 \overline{y}'_2 + \overline{x}_2 y'_2 + \overline{y}_2 y'_2) \cdot$$
$$[(\overline{z}'_2 x_2 y'_1 + \overline{z}'_2 \overline{x}_2 + \overline{z}'_2 \overline{y}'_1) \cdot$$
$$(y'_2 \cdot x_2 y'_1 + \overline{y}'_2 \overline{x}_2 + \overline{y}'_2 \overline{y}'_1)] \cdot$$
$$x_2 (y_1 y'_1 + \overline{y}_1 \overline{y}'_1)$$
$$= \emptyset$$

FIG. 6F

| BITS | CPU (h:mm:ss) | MEMORY (MEGABYTES) | MAXIMUM ITERATIONS |
|---|---|---|---|
| 8 | 0:00:02 | 5.5 | 3 |
| 12 | 0:00:25 | 10.5 | 4 |
| 16 | 0:01:44 | 16.2 | 5 |
| 20 | 0:20:07 | 37.3 | 5 |
| 24 | 1:00:57 | 85.9 | 5 |
| 28 | 3:05:27 | 127.5 | 5 |
| 32 | 5:50:27 | 130.4 | 6 |

FIG. 7

METHOD AND APPARATUS FOR IMPLICIT VERIFICATION OF DIGITAL CIRCUITS

FIELD OF THE INVENTION

The present invention relates generally to digital circuit design verification, and more particularly to formal verification across differing circuit architectures.

BACKGROUND OF THE INVENTION

In the design of digital integrated circuits, it is often desirable to be able to ascertain whether two circuits are equivalent. Equivalency of two combinational circuits can be defined, in a functional sense, as follows. A first design and a second design are equivalent if both accept the same set of input combinations, and if both produce the same output combination for each input combination.

The determination of circuit equivalence has become increasingly important with the emergence of large scale digital integrated circuits that incorporate an entire system on a chip. Such chips have reached a size and complexity level where it is difficult to verify them, in a timely manner, using traditional gate-level simulation. As a result, static verification tools are being more widely utilized by chip designers. Examples of such static-verification tools are PrimeTime, a static-timing analyzer, and Formality, a formal verification tool. Both PrimeTime and Formality are products of Synopsys, Inc., 700 East Middlefield Road, Mountain View, Calif. Static-timing analysis is used to analyze and verify the timing of the design and formal verification is used to verify a design's functionality by proving functional equivalence.

A design methodology that utilizes formal verification can reduce the number of time-consuming gate-level simulation runs. In a typical design process, utilizing logic synthesis and formal verification tools, the designer specifies his or her initial design at the register-transfer level (RTL). This RTL source specification is translated into a gate-level netlist by a logic synthesis tool, such as Design Compiler, produced by Synopsys, Inc., 700 East Middlefield Road, Mountain View, Calif. Formal verification is then used to compare the functional equivalency of the RTL source specification to the post-synthesis gate-level netlist. This gate-level netlist may then undergo several succeeding transformations that are intended to produce equivalent gate-level netlists. Such succeeding transformations can include: scan chain insertion, clock-tree synthesis, in-place optimization and manual editing. After each of these succeeding transformations, formal verification can be used to verify that the result of the latest transformation is functionally equivalent to the resulting gate-level netlist of the preceding transformation. For each of these comparisons a known-to-be-correct design (reference design) is compared against a design of unknown correctness (implementation design).

While formal equivalence checkers generally provide better coverage than gate-level simulation, such formal equivalence checking is fundamentally an NP-complete problem and therefore existing algorithms do not use reasonable memory or CPU resources for certain classes of circuits.

For example, (binary decision diagrams) BDDs have been successfully used for formal equivalency checking, but there are many functions for which the size of the BDD is exponential with respect to the size of the circuit being verified. This is most commonly known to occur with multiplier circuits. BDDs are generally incapable of verifying multipliers with more than sixteen bits in the multiplicands.

Other approaches to formal equivalency checking utilize the fact that (as discussed above) the implementation circuit is derived directly from the reference circuit through synthesis. Because of this, the two circuits usually have a great deal of structural similarity. Certain verification algorithms take advantage of this similarity by trying to find internal equivalence points and simple implications which enable the verification process to succeed. As long as the implementation circuit is directly synthesized from the reference circuit, such approaches can be successful and have been shown to verify multiplier circuits with multiplicand widths in excess of 64 bits. Unfortunately, multipliers with different architectures do not provide enough structural similarity to allow verification with the these methods.

Architectural changes are common, however, and particularly during the earlier part of the design process. For example, with respect to multipliers, it is common to swap one multiplier architecture for another in order to explore design tradeoffs. As a specific example, it would not be uncommon to substitute an array multiplier (as shown in FIG. 1) for a Wallace-tree multiplier (as shown in FIG. 2), or vice versa.

Across different architectures, there are known methods for verification, but only if the verification tool knows that the circuits to be verified are multipliers and also knows how the integers processed by the multiplier are encoded.

It would therefore be desirable to develop a general technique for formally determining equivalence between circuits of different architectures such that it is not necessary for the verification tool to know the particular functionality of the circuits to be compared nor the specific way in which the operands of the circuits are encoded.

SUMMARY OF THE INVENTION

The present invention utilizes a particular type of structural similarity between the reference and implementation designs, which we shall refer to as "structural dependence," in order to broaden the class of circuits that are formally verifiable in an efficient manner. Structural dependence is the dependence of the higher-order result bits of a design upon the circuitry driving the lower-order result bits.

Because structural dependence is a rather general and high-level characteristic, two circuits which might be considered, according to conventional standards, as having very different structures and therefore not amenable to efficient formal verification, may in fact be efficiently comparable using the present invention.

Structural dependence is utilized in partitioning the two circuits, $\eta$ and $\eta'$, to be compared. Each circuit has the fanin cones of its primary inputs ordered from smallest to largest. Each such fanin cone is the basis for forming a circuit partition, but part of a fanin cone may be excluded from a partition to the extent it is already part of another partition.

Structural dependence partitioning creates subcircuits $\eta_i$ for circuit $\eta$ and subcircuits $\eta'_i$ for circuit $\eta'$. Each subcircuit (or partition) $\eta_i$ drives a primary output $z_i$ and each subcircuit (or partition) $\eta'_i$ drives a primary output $z'_i$. In addition, each subcircuit $\eta_i$ may have: a fanout set $Y_i$ to its higher order subcircuit $\eta_{i+1}$, (if it has a higher order subcircuit and is connected to it), inputs from the fanout set $Y_{i-1}$ of its lower order subcircuit $\eta_{i-1}$, (if it has a lower order subcircuit and is connected to it) and primary inputs from X (if it is driven by one or more primary inputs). Likewise, each subcircuit $\eta'_i$ may have: a fanout set $Y'_i$ to its higher order subcircuit $\eta'_{i+1}$ (if it has a higher order subcircuit and is connected to it), inputs from the fanout set $Y'_{i-1}$ of its lower order subcircuit $\eta'_{i-1}$ (if it has a lower order subcircuit and is connected to it) and primary inputs from X (if it is driven by one or more primary inputs).

Since the lower order primary output bits have smaller fanin cones with fewer inputs than the higher order bits, they may be verifiable by known techniques. As we proceed toward the higher order bits, however, implicit verification using structural dependence becomes increasingly important.

Implicit verification operates as follows, for example, with respect to verifying the high-order primary output bit of two n bit circuits. While the following discussion is stated with respect to two multiplier circuits being compared, it applies to any two circuits which have been partitioned according to structural dependency.

A condition called C is defined which asserts that the high order primary output bits, of each of the two multipliers being compared, are equivalent. More specifically, condition C asserts that $z_{n-1}=z'_{n-1}$. At this point we are only considering $z_{n-1}$ and $z'_{n-1}$ as being outputs, respectively, of subcircuits $\eta_{n-1}$ and $\eta'_{n-1}$.

A condition A is defined which asserts that all the lower-order primary output bits of the two multipliers are equivalent. More specifically, condition A asserts that $z_i=z'_i$ for $0 \leq i < n-1$. Thus all the remaining subcircuits, $\eta_0$ to $\eta_{n-2}$ and $\eta'_0$ to $\eta'_{n-2}$, are being considered in A.

We then try to prove the implication that if A is true then C is true, or mathematically A→C. This is equivalent to showing that the conjunction of A being true and C not being true can never be true, or mathematically A·$\overline{C}$=0.

Once A→C has been proven true, assuming that condition A is known to be true, it is then known by implication that C is true.

Implicit verification utilizes the fact that it is usually easier to prove the implication A→C than to prove C in isolation, since A being true while C being false usually has many conflicting requirements.

Rather than initially formulating a condition A comprised of asserting all lower order bits (i.e., those bits of lower order than C) as being equivalent, it is often advantageous to begin with an assertion (which shall be referred to as $A_{n-2}$) that just the next lower order bits are equivalent (i.e., $z_{n-2}=z'_{n-2}$). This more limited assertion may provide sufficient constraints such that the implication $A_{n-2}$→C can be proven. At this point, only subcircuits $\eta_{n-1}$, $\eta'_{n-1}$, $\eta_{n-2}$ and $\eta'_{n-2}$ are being considered. If $A_{n-2}$ does not provide sufficient constraints, then it can be successively augmented with assertions that the next lower pairs of output bits are equivalent. For example, the next lower pair of output bits to be asserted as equivalent would be $z_{n-3}=z'_{n-3}$ (which shall be referred to as $A_{n-3}$). At this point only subcircuits $\eta_{n-3}$ and $\eta'_{n-3}$ are being added for consideration in addition to the subcircuits $\eta_{n-1}$, $\eta'_{n-1}$, $\eta_{n-2}$ and $\eta'_{n-2}$ already considered for $A_{n-2}$→C. If the implication $A_{n-2} \cdot A_{n-3}$→C can be proven true, then the next lower pair of output bits (which would result in the implication $A_{n-2} \cdot A_{n-3} \cdot A_{n-4}$→C) need not be considered.

In order to prove a particular condition (or antecedent) A as being true, such that it can be used in conjunction with a proven implication A→C to show that a consequent C is true, it is often advantageous to prove a "chain" of implications. The chain of implications typically begins with an implication whose consequent asserts the equivalency of low order output bits and therefore has an antecedent A that is provable by conventional means. Once the implication for the low order output bits has "fired" (i.e., its antecedent has been satisfied), its consequent can be used, in turn, to fire an implication for asserting the equivalency of the next higher-order output bit pair. Similarly, the equivalency of the next higher-order output bit pair can be used to fire an implication for proving equivalency of an even higher-order output bit pair. Such a chain of implication firings continues until all output bits, between the two circuits to be compared, have been shown equivalent.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 5 presents the pseudo-code for implementing the general method of implicit verification of the present invention;

FIGS. 6A through 6F presents a simulated "execution" of the pseudo-code of FIG. 5 according to the exemplary circuits of FIG. 4;

FIG. 7 shows a table of experimental results from running a programmed implementation of the procedure of FIG. 5;

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

The present invention utilizes a particular type of structural similarity between the reference and implementation designs, which we shall refer to as "structural dependence," in order to broaden the class of circuits that are formally verifiable in an efficient manner. Structural dependence is the dependence of the higher-order result bits of a design upon the circuitry driving the lower-order result bits. Structural dependence is a feature of multiplier circuits, and it is a characteristic found in many other types of circuits as well.

Figure 1:
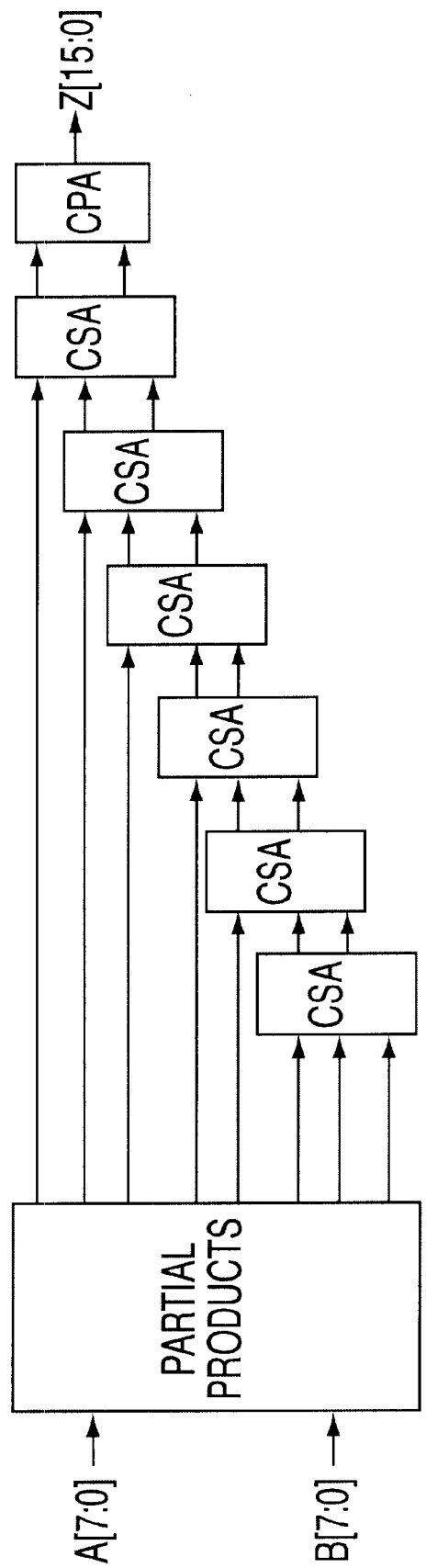
FIG. 1 shows an eight-bit array multiplier as an exemplary architecture for verification by the present invention.
Figure 2:
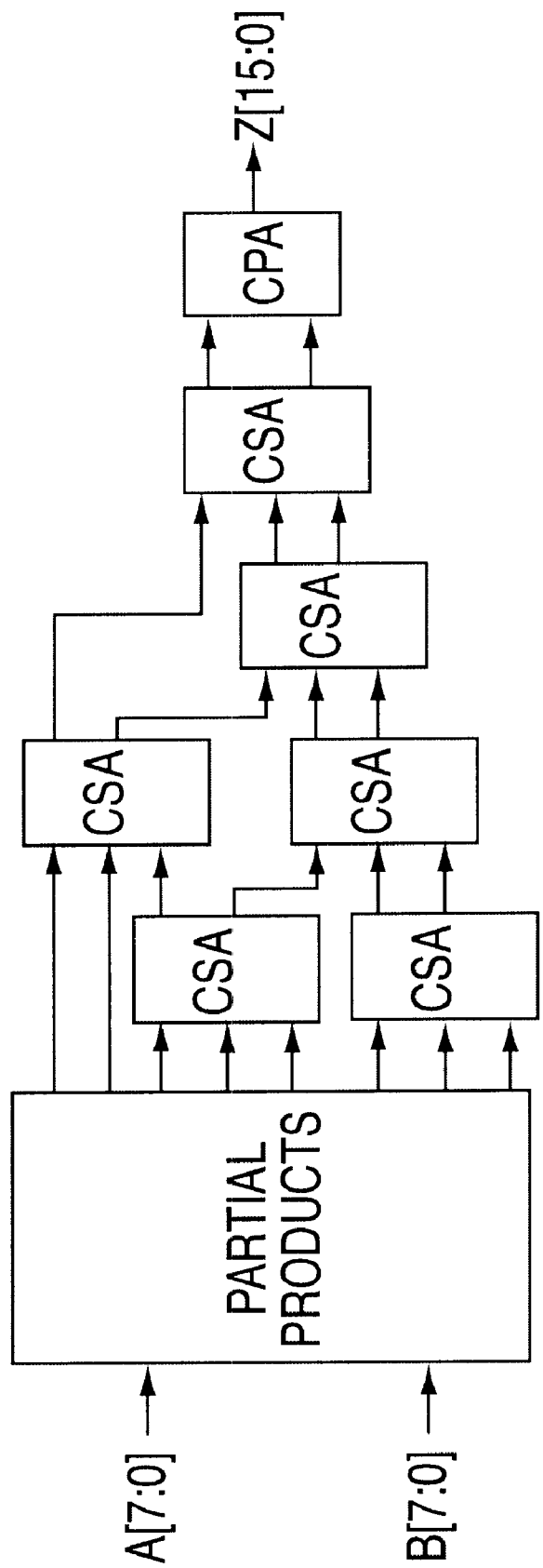
FIG. 2 shows an eight-bit Wallace tree multiplier as an exemplary architecture for verification by the present invention.

Because structural dependence is a rather general and high-level characteristic, two circuits which might be considered, according to conventional standards, as having very different structures and therefore not amenable to efficient formal verification, may in fact be efficiently comparable using the present invention. For example, according to conventional standards, an array multiplier (as shown in FIG. 1) and a Wallace-tree multiplier (as shown in FIG. 2) would be considered architecturally different. However, because both these multiplier architectures share the property of structural dependence, they can be efficiently compared with each other by the present invention. A detailed discussion of the array multiplier and Wallace-tree multiplier architectures is presented below in connection with a discussion of certain test results from an implementation of the present invention.

STRUCTURAL DEPENDENCE

Figure 3:
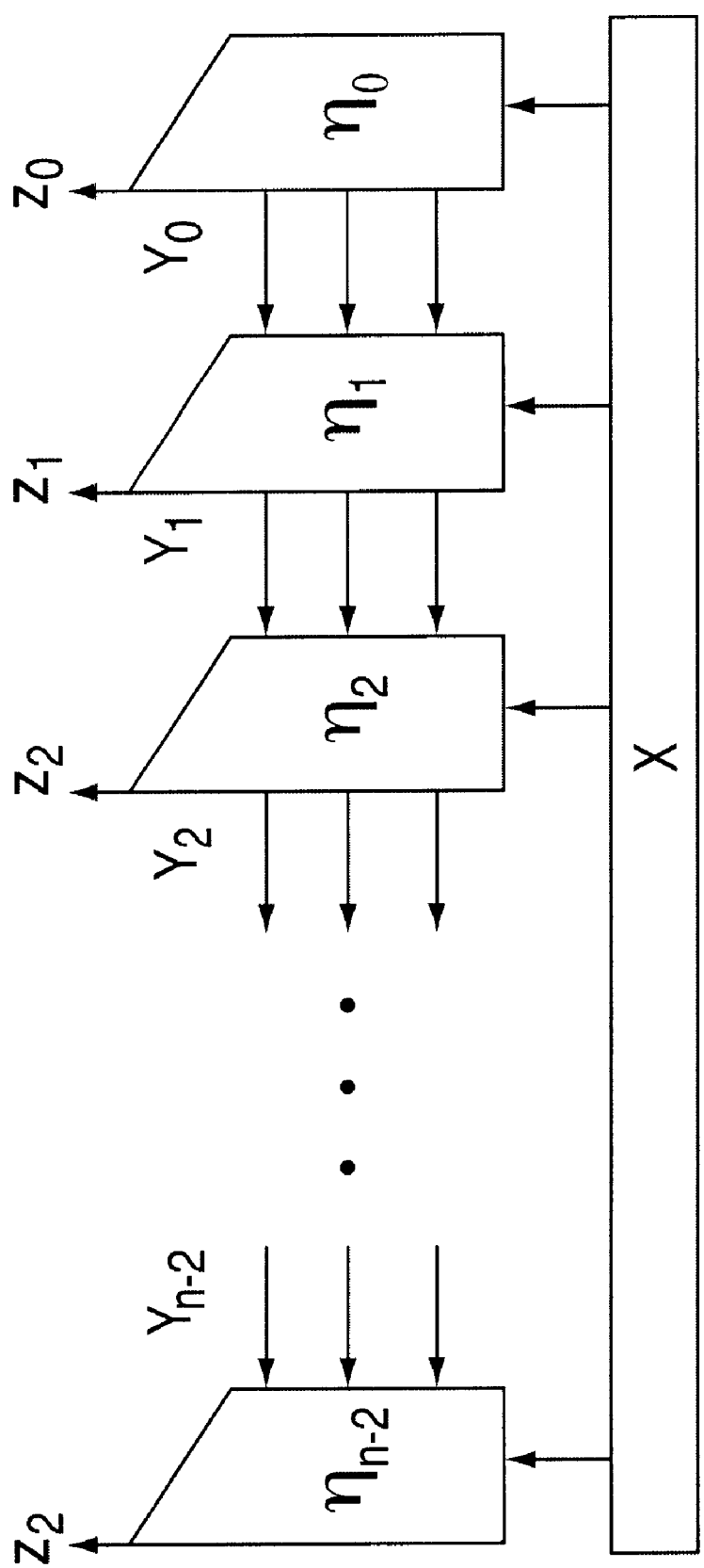
FIG. 3 depicts a partitioning of a circuit in accordance with its structural dependence.

Structural dependence means that the primary output bits of a circuit can be ordered, from higher to lower order, such that the logic which drives the higher order primary output bits depends heavily on the logic driving the lower order primary output bits. Structural dependence in a circuit η is determined by partitioning the circuit as follows. The result of partitioning a circuit η, in accordance with the following method, is depicted in FIG. 3.

Let circuit η have primary inputs $X=\{x_0, \ldots, x_{m-1}\}$ and primary outputs $Z=\{z_0, \ldots, z_{n-1}\}$.

First, order the primary outputs, from $z_0$ to $z_{n-1}$, based on the increasing size of their fanin cones.

Starting with the smallest cone, whose output is called $z_0$, all the gates in the fanin of $z_0$ are marked as being in the subcircuit $\eta_0$. Nets whose source is in $\eta_0$ (and are not driven directly by a primary input), but which have sinks in other parts of the circuit, we place in the fanout set $Y_0$.

Next, all cells in the fanin cone of output $z_1$, which are not already in $\eta_0$, are put in subcircuit $\eta_1$. Nets whose source is in $\eta_1$ (and are not driven directly by a primary input), but which have sinks in other parts of the circuit, we place in the fanout set $Y_1$. Note that no net in $Y_1$ can have a sink in $\eta_0$.

Third, all cells in the fanin cone of output $z_2$, which are not already in $\eta_0$ or $\eta_1$, are put in subcircuit $\eta_2$. Nets whose source is in $\eta_2$ (and are not driven directly by a primary input), but which have sinks in other parts of the circuit, we place in the fanout set $Y_2$. Note that no net in $Y_2$ can have a sink in $\eta_0$ or $\eta_1$.

We continue in this fashion, for each output $z_i$, creating a subcircuit $\eta_i$ and a fanout set $Y_i$, until we reach the last output $z_{n-1}$.

Each subcircuit $\eta_i$ computes a function $f_i(X, Y_{i-1})$. Note that the fanout set $Y_{n-1}$ is necessarily empty.

If the sizes of the fanout sets are relatively large compared to the size of X, then we say that the circuit exhibits structural dependence.

IMPLICIT VERIFICATION OVERVIEW

Assume we have two structurally dependent circuits η and η' that are to be shown equivalent. Each circuit is partitioned as discussed above (and shown in FIG. 3), creating subcircuits $\eta_i$ with fanout sets $Y_i$ for circuit η and subcircuits $\eta'_i$ with fanout sets $Y'_i$ for circuit η'. Since the lower order primary output bits have smaller fanin cones with fewer inputs than the higher order bits, they may be verifiable by known techniques. As we proceed toward the higher order bits, however, implicit verification using structural dependence becomes increasingly important.

Implicit verification operates as follows, for example, with respect to verifying the high-order primary output bit of two n bit circuits. While the following discussion is stated with respect to two multiplier circuits being compared, it applies to any two circuits which have been partitioned according to structural dependency.

A condition called C is defined which asserts that the high order primary output bits, of each of the two multipliers being compared, are equivalent. More specifically, condition C asserts that $z_{n-1}=z'_{n-1}$. At this point we are only considering $z_{n-1}$ and $z'_{n-1}$ as being outputs, respectively, of subcircuits $\eta_{n-1}$ and $\eta'_{n-1}$.

A condition A is defined which asserts that all the lower-order primary output bits of the two multipliers are equivalent. More specifically, condition A asserts that $z_i=z'_i$ for $0 \leq i < n-1$. Thus all the remaining subcircuits, $\eta_0$ to $\eta_{n-2}$ and $\eta'_0$ to $\eta'_{n-2}$, are being considered in A.

We then try to prove the implication that if A is true then C is true, or mathematically A→C. This is equivalent to showing that the conjunction of A being true and C not being true can never be true, or mathematically $A \cdot \overline{C}=0$.

$A \cdot \overline{C}=0$ can be proven by a variety of methods. In a first embodiment, all combinations of inputs to the function $A \cdot \overline{C}$ are applied and none are shown to satisfy the expression. In a second embodiment, A and $\overline{C}$ are each represented by BDDs which are then conjuncted together, in a manner known in the art, resulting in a BDD whose output value can be determined as being only zero.

Note also that proving $A \cdot \overline{C}=0$ is mathematically equivalent to proving $\overline{A}+C=1$.

Once A→C has been proven true, assuming that condition A is known to be true, it is then known by implication that C is true.

Implicit verification utilizes the fact that it is usually easier to prove the implication A→C than to prove C in isolation, since A being true while C being false usually has many conflicting requirements.

IMPLICIT VERIFICATION PSEUDO-CODED METHOD

Before giving the pseudo-coded method for implicit verification, it will be useful to introduce a few additional definitions.

For a circuit η with inputs X and outputs Z, an input-output relation of η is defined to be the function $\chi(X,Z) \rightarrow \{0,1\}$ where $\chi=1$ only for consistent assignments of the inputs and outputs of η. The input-output relation of η can be built as follows. Let $Z=\{z_i\}$ be the set of outputs of η which implements functions $z_i=f_i(X)$. Then $\chi(X,Z)=\Pi(\overline{z_i \oplus f_i})$.

A subcircuit $\eta_i$, with inputs $X_i$ and outputs $Z_i$, has the same definition for $\chi_i$ as described above for the entire circuit η, except that $X_i$ and $Z_i$ are defined as follows. $X_i$ is comprised of any primary inputs to $\eta_i$ and of any inputs to $\eta_i$ that belong to $Y_{i-1}$. $Z_i$ is comprised of the primary output $z_i$ of $\eta_i$ and of any outputs that belong to $Y_i$.

A pseudo-code description for the general method is depicted in FIG. 5.

The two circuits η and η' to be verified are passed to the procedure "imp_ver."

The partitioning operation invoked in line 2 partitions each of η and η' according to the procedure discussed above with respect to FIG. 3.

The outer "for" loop, beginning at line 3, attempts to verify the equivalency of each output pair of outputs $z_i$ and $z'_i$. For each such pair, the following operations are performed.

The consequent condition $\overline{C}$, that $z_i \neq z'_i$, is formed by determining $f_i \oplus f'_i$. As discussed previously with respect to partitioning, $f_i$ is the output of subcircuit $\eta_i$, not of the entire circuit η, and $f'_i$ is the output of subcircuit $\eta'_i$, not of the entire circuit η'. As discussed above with respect to the overview of implicit verification, $\overline{C}$ is formed, rather than C, because the object is to prove A→C by showing that A·$\overline{C}$=0. Computing $\overline{C}$ puts constraints on the inputs of $\eta_i$ and $\eta'_i$.

The inner "for" loop creates the antecedent A by adding, one at a time, the condition that the previous pairs of outputs, $z_j$ and $z'_j$, are equivalent. This is accomplished in line 6 by forming the conjunction of the input-output relations for subcircuits $\eta_i$ and $\eta'_i$ (i.e., $\chi_j \cdot \chi'_j$) and taking the conjunction of that with the assertion that the output functions of subcircuits $\eta_i$ and $\eta'_i$ are equal (i.e., $\overline{f_j \oplus f'_j}$).

If the quantity g ever becomes zero, then a "break" from the inner "for" loop is performed, in accordance with line 7, and the outputs $z_i$ and $z'_i$ are marked as implicitly verified. As discussed above, the determination of g as being zero can be accomplished by a variety of methods including proof by contradiction or conjunction of BDDs representing g, $\chi_j$, $\chi'_j$ and ($\overline{f_j \oplus f'_j}$).

If the inner "for" loop ends without g becoming zero, then, in accordance with line 9, the outputs $z_i$ and $z'_i$ are marked as not being implicitly verified. In addition to marking the outputs as not being implicitly verified, a break from the outer "for" loop is performed with a notation that verification has failed. This breaking from the outer "for" loop ensures that whenever g does become zero (a condition that by itself only indicates that an implication has been proved) the pair of outputs represented by g has been identified as equivalent, since the outer loop would not have reached this point unless all the lower-order pairs of outputs have already been verified as equivalent.

If the outer "for" loop ends with all pairs of outputs being marked as equivalent, then the two circuits $\eta$ and $\eta'$ are equivalent.

IMPLICIT VERIFICATION EXAMPLE

Pseudo-coded implicit verification will now be applied to the specific example of FIG. 4.

Figure 4A:
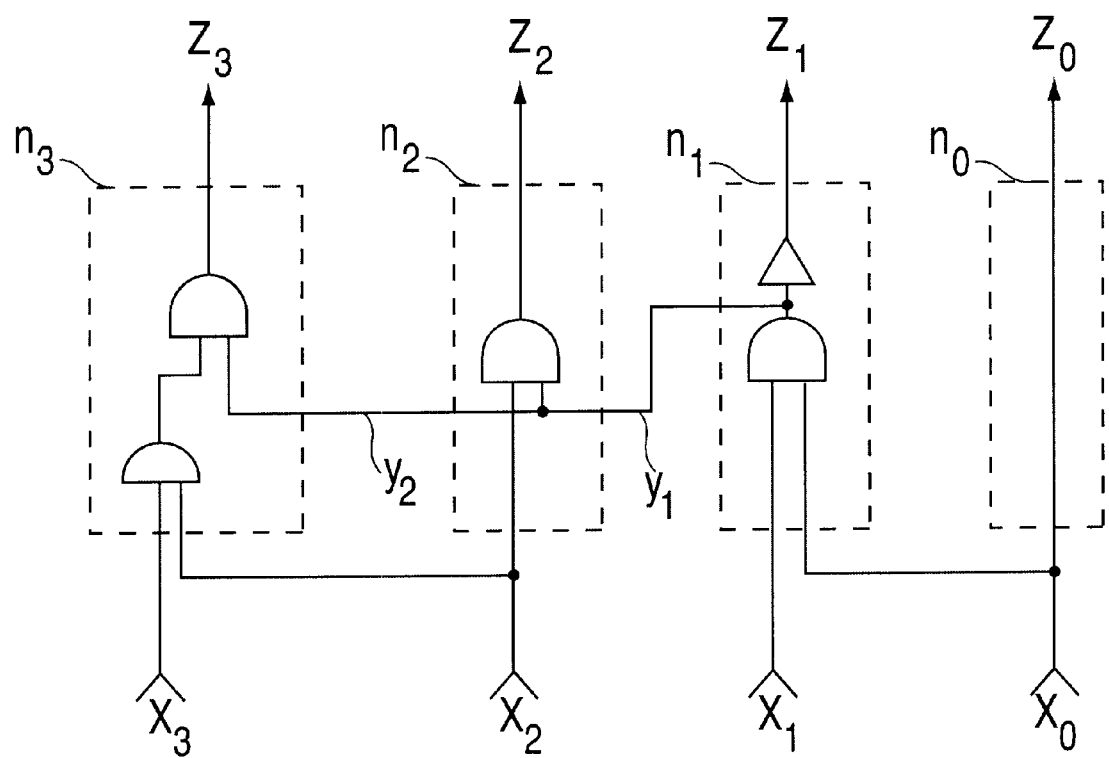
FIGS. 4A and 4B illustrates two exemplary circuits for verification by the present invention and their partitioning into subcircuits by the present invention.
Figure 4B:
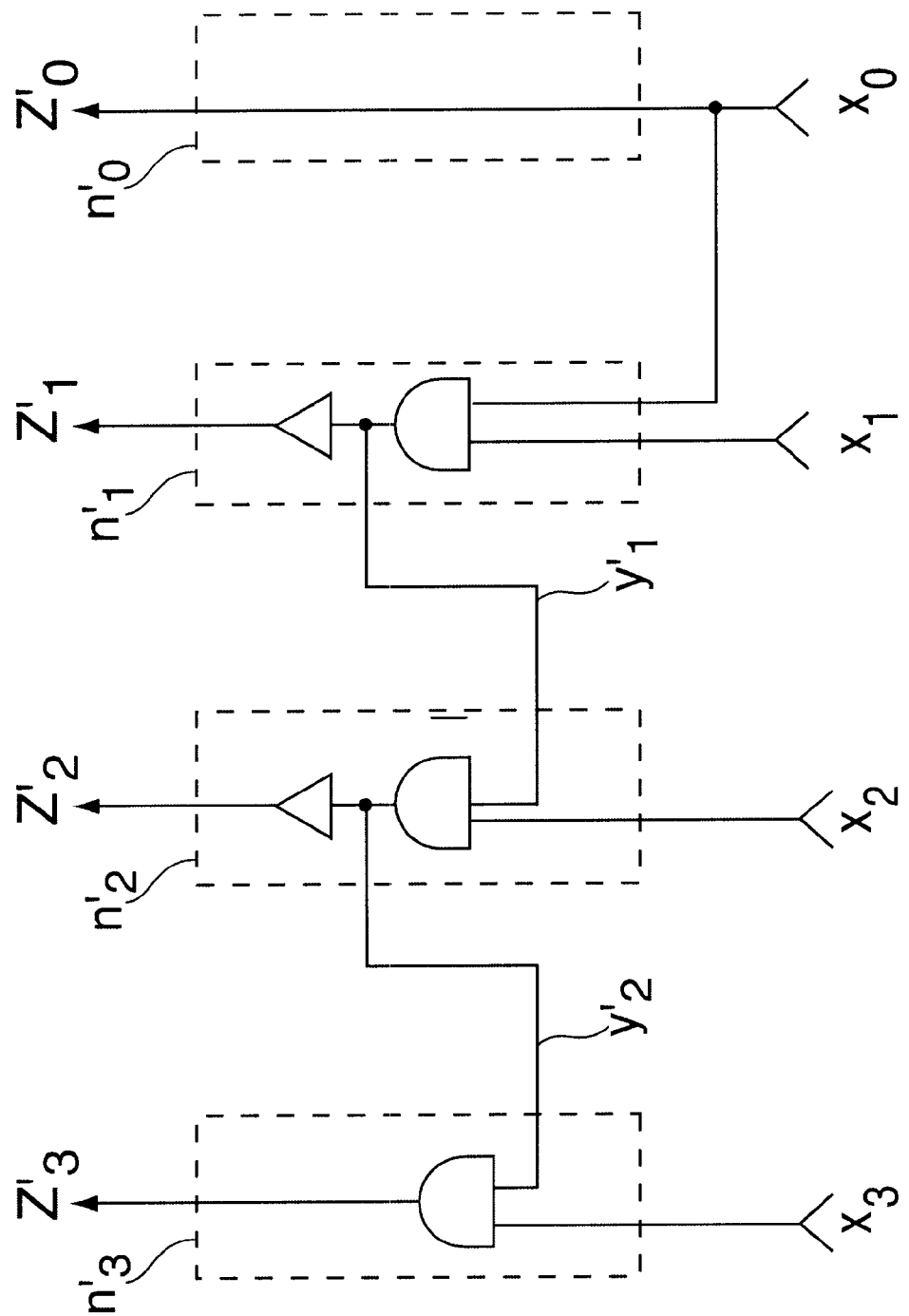

FIGS. 4A and 4B depict, respectively, two circuits $\eta$ and $\eta'$ for verification by the pseudo-code method of FIG. 5. As can be seen, circuit $\eta$ has already been partitioned into structurally dependent subcircuits $\eta_0$ to $\eta_3$, while circuit $\eta'$ has already been partitioned into structurally dependent subcircuits $\eta'_0$ to $\eta'_3$.

FIG. 6A depicts the functions $f_0$ to $f_3$ and $\chi_0$ to $\chi_3$ that represent $\eta_0$ to $\eta_3$ in the execution of the FIG. 5 pseudo-code. Similarly, FIG. 6B depicts the functions $f'_0$ to $f'_3$ and $\chi'_0$ to $\chi'_3$ that represent $\eta'_0$ to $\eta'_3$ in the execution of the FIG. 5 pseudo-code. FIGS. 6A and 6B correspond to the execution of line 2 of the pseudo-code. It should be noted that while the symbol of a Hi plus-sign surrounded by a circle ("⊕") has been used to represent the exclusive-OR function, the similar symbol of a dot surrounded by a circle is being used to represent the exclusive-NOR function.

FIG. 6C depicts the pseudo-code "for" loop of line 3 performing its first iteration with i=0. Specifically, FIG. 6C depicts the equation for g as computed at line 4. The inner "for" loop of line 5 is never executed and therefore imp_ver proceeds directly to line 9 where the g of FIG. 6C is determined to always compute the result zero. As discussed above, the determination of g as always resulting in a zero value may be accomplished by a variety of methods. For the purposes of illustration herein, the determination is made by noting that the variable $x_0$ will never be different from itself. This determination of g proves that the lowest level bits of the two designs are equivalent.

FIG. 6D depicts the pseudo-code "for" loop of line 3 performing its second iteration with i=1. Specifically, FIG. 6D first depicts the equation for g as computed at line 4. The inner "for" loop of line 5 is then represented with j=0. The function g is recomputed according to line 6 of the pseudo-code and as shown in FIG. 6D below j=0. In accordance with line 7, and as further shown in FIG. 6D, g is determined to always compute the result zero with the result that the inner "for" loop is broken. For the purposes of illustration herein, the determination is made by noting that $x_0 x_1$ is never different from itself. Therefore, the g on the right-hand-side of the expression of line 7 is always of value zero, making the entire conjunction of the right-hand-side zero. Execution then proceeds to line 9 where it is noted that bits $z_1$ and $z'_1$ have been proven equivalent.

FIG. 6E depicts the pseudo-code "for" loop of line 3 performing its third iteration with i=2. Specifically, FIG. 6E first depicts the equation for g as computed at line 4. The inner "for" loop of line 5 is then represented with j=1. The function g is recomputed according to line 6 of the pseudo-code and as shown in FIG. 6E below j=1. In accordance with line 7, and as further shown in FIG. 6E, g is determined to always compute the result zero with the result that the inner "for" loop is broken. For the purposes of illustration herein, the determination is made by transforming the right-hand-side of the expression of line 6 into a sum-of-products form (such complete transformation to sum-of-products form not being shown in FIG. 6E). It is then noted that every product term of the sum-of-products form requires at least one of its variables to be both TRUE and not TRUE. Therefore it is noted that every product term evaluates to zero. Execution then proceeds to line 9 where it is noted that bits $z_2$ and $z'_2$ have been proven equivalent.

FIG. 6F depicts the pseudo-code "for" loop of line 3 performing its fourth iteration with i=3. Specifically, FIG. 6F first depicts the equation for g as computed at line 4. The inner "for" loop of line 5 is then represented with j=2. The function g is recomputed according to line 6 of the pseudo-code and as shown in FIG. 6F below j=2. In accordance with line 7, and as further shown in FIG. 6F, g is determined to always compute the result zero with the result that the inner "for" loop is broken. For the purposes of illustration herein, the determination is made by transforming the right-hand-side of the expression of line 6 into a sum-of-products form (such complete transformation to sum-of-products form not being shown in FIG. 6F). It is then noted that every product term of the sum-of-products form requires at least one of its variables to be both TRUE and not TRUE. Therefore it is noted that every product term evaluates to zero. Execution then proceeds to line 9 where it is noted that bits $z_3$ and $z'_3$ have been proven equivalent. With respect to the Summary of the Invention above, this execution of the outer "for" loop has proven $A_2$→C, with only subcircuits $\eta_2$, $\eta'_2$, $\eta'_3$ and $\eta'_3$ being considered.

Execution of the outer "for" loop then ends and line 12 is executed. Since all pairs of outputs between $\eta$ and $\eta'$ have been verified as equivalent, the value "SUCCESS" is returned by imp_ver.

In summary, the operation of the FIG. 5 pseudo-code can be viewed as follows.

For each iteration of the outer "for" loop of line 3, a function g is computed which represents, in sum-of-products (SOP) form, a "set" of product terms. Each product term represents a combination of values which, when applied to the inputs of $\eta_i$ and $\eta'_i$, cause the $z_i$ and $z'_i$ outputs to be different. This set of possible combinations is then further constrained, and hopefully reduced to an empty set, by the combinations of inputs and/or outputs permitted by the lower-order bits of circuits $\eta$ and $\eta'$.

Specifically, the inner "for" loop of line 5 begins with the subcircuits of the next most significant outputs $z_j$ and $z'_j$. The right side of the expression of pseudo-code line 6 can be viewed as follows. The exclusive-NOR function represents, in SOP form, the combinations of values which, when applied to the inputs of $\eta_j$ and $\eta'_j$, cause the $z_j$ and $z'_j$ outputs to be the same. The conjunction $\chi_j$ and $\chi'_j$ represents the combinations of values which, if applied to the inputs and outputs of $\eta_j$ and $\eta'_j$, are consistent with the operation of $\eta_j$ and $\eta'_j$. The set of combinations of $\chi_j \cdot \chi'_j$ is typically narrowed in its conjunction with the combinations of the exclusive-NOR function. The net result of determining $\chi_j \cdot \chi'_j \cdot (\overline{f_j \oplus f'_j})$ is to produce a set of combinations which limit the values that all inputs into $\eta_i$ and $\eta'_i$ (both the $Y_j$ and $Y'_j$ inputs, as well as the primary inputs) may assume.

If $\chi_j \cdot \chi'_j \cdot (\overline{f_j \oplus f'_j})$ does not provide enough constraints to bring g to zero, then another iteration of the inner "for" loop is performed, in which the constraints of the next less significant subcircuits are added.

As discussed above, the inner "for" loop will continue adding constraints, if necessary, until it utilizes the entire portion of circuits $\eta$ and $\eta'$ upon which $\eta_i$ and $\eta'_i$ are structurally dependent by including the constraints of the least significant subcircuits $\eta_0$ and $\eta'_0$.

Note that while the inner "for" loop of line 5 proceeds from i−1 to 0, an alternative approach would be for the loop to iterate from 0 to i−1 (although this approach would typically result in a consideration of all the bits from 0 to i−1).

Also note that while the outer "for" loop of line 3 proceeds from 0 to n−1, an alternative approach would be for the loop to iterate from n−1 to 0. Note that running the outer "for" loop in reverse effects the interpretation of any errors detected: an error detected while i is equal to some iteration value k (where $0 \leq k \leq n-1$) means that there is a lack of equivalency in all bits iterated over thus far, from i=n−1 down to and including i=k. When the outer "for" loop is proceeding from 0 to n−1, the detection of a lack of equivalency at bit i=k does not affect the fact that all the lower order bits, from i=0 up to and including i=k−1, have been verified.

TWO EXEMPLARY MULTIPLIER ARCHITECTURES

Array and Wallace-tree multipliers share the following architectural similarities. Given two n bit numbers, n partial products (of n bits each) are first generated. These n numbers are added together to form a total product. These two multiplier architectures differ, mainly, in how the partial products are added together.

In the "array multiplier," for example, the partial products are added in a serial fashion using a linear array of carry-save adders (CSAs). CSAs are circuits which transform the problem of adding three numbers into the problem of adding two numbers. The advantage of CSAs is that they can perform their task in O(1) time. In the serial CSA array portion of an array multiplier (which adds the n partial products), CSAs must be utilized n times resulting in this portion of the array multiplier operating in O(n) time. At the end of the CSA serial array, the last two numbers are added with a carry-propagate adder (CPA), such as a carry-lookahead adder, which operates in O(log n) time. Thus the total time required for an array multiplier is O(n+log n)=O(n). FIG. 1 shows the array multiplier architecture schematically for eight bits.

In the "Wallace tree" multiplier architecture, as with the array multiplier architecture, the partial products are added using CSAs followed by a CPA. The Wallace tree architecture differs from the array multiplier architecture by arranging the CSAs in a balanced tree rather than as a linear array. The depth of the Wallace tree multiplier balanced tree is O(log n). When this balanced tree is followed by a CPA, the total time of the multiplication is O(log n+log n)=O(log n). FIG. 2 shows the Wallace tree architecture schematically for eight bits.

According to conventional standards, the array multiplier and Wallace tree multiplier do not share much structural similarity. There are no internal points which are functionally equivalent and it is difficult to form any implications between any two internal points of these circuits. Therefore, according to conventional techniques, it is difficult to formally verify equivalence between these two architectures.

These two architectures, however, both have a high degree of structural dependence making them efficiently verifiable with the techniques of the present invention.

TEST RESULTS

The procedure of FIG. 5 has been embodied as a program and used to verify array multipliers and Wallace-tree multipliers, generated with the architecture described above, for varying bit widths. The bit widths verified range from 8 to 32 bits.

Before verifying two multipliers, a preprocessing step was executed to determine any structurally equivalent points, according to known standards, in the two circuit networks. Since the array and Wallace-tree architectures are so structurally different, by known standards, the only equivalent points found were from the partial products next to the primary inputs. These partial products were then treated as primary inputs for purposes of applying the method of the present invention. Partitioning the circuits for structural dependence included sorting the outputs of each multiplier circuit according to the size of their variable support which has the result of effectively sorting the outputs from most-significant bit to least-significant bit. The functions determined for each multiplier circuit, in accordance with FIG. 5, were represented by BDDs. The basic operations of FIG. 5 were performed on the BDDs with a conventional BDD processing package having its dynamic variable ordering enabled. The results are presented in the table of FIG. 7, and discussed column-by-column as follows.

As can be seen, multipliers with 16 bits or less verified in under two minutes. Beginning with multipliers of 20 bits or more, CPU times greatly increased. This is believed to be due to the fact that dynamic variable reordering was needed and is computationally expensive. Multipliers of 32 bits were verified in under 6 hours. We are unaware of any known verification method which is able to verify multipliers of this size where the architectures are different as they are in this test case.

The amount of memory required approximately doubled for each additional four bits in the multipliers until 28 bits was reached. The memory requirements for verifying 28 and 32 bit multipliers were approximately the same. This is believed to be due to a hard limit on the number of BDD nodes required to trigger variable reordering. By repeatedly reaching this limit and significantly reducing the size of the BDDs each time the limit is reached, the maximum amount of memory used remained relatively constant.

The last column of FIG. 7 provides the maximum number of iterations required of the inner loop of the procedure of FIG. 5. This corresponds to the maximum number of lower order bits necessary for addition to the antecedent before a contradiction, to the assertion that the two bits being verified are not equivalent, is found. This number is small, compared to the total number of bits in the multiplier, for all the multiplier sizes tested. Consequently, for each pair of bits verified, a relatively small portion of the multiplier circuits was traversed.

OPERATING CHARACTERISTICS

Based on the above results and analyses of the present invention, certain operating characteristics are expected of the present invention, particularly with respect to the verification of multiplier circuits.

Consider the case of verifying two multipliers, each with n bits for outputting the product, with the verification process proceeding from the $0^{th}$ output bits of each multiplier up to the $n-1^{th}$ output bits of each multiplier. A characteristic utilization of computational resources (i.e., memory and/or time) is expected and illustrated in FIG. 9C. Specifically, proceeding from the $0^{th}$ bits of the two multipliers, up to about the middle bits (i.e., around the ½×(n−1) bits), the time and/or memory resources required for verifying each successively higher-order bit will increase. This is shown by the generally upward sloping segment 902 of the graph of FIG. 9C. After peaking at around these middle bits, the time and/or memory resources required for verifying each successively higher-order bit will tend to decrease until the last $n-1^{th}$ output bit is reached. This is depicted in FIG. 9C as the generally downward sloping segment 903.

For certain circuit constructions, however, this characteristic can be expected to vary in a predictable manner. Consider, for example, the circuit of FIG. 9A. This circuit is a multiplier with a total of n−1 output bits. If such a circuit were to be verified, for example, against itself the present invention would be expected to exhibit a characteristic such as is shown in FIG. 9C.

Figure 9A:
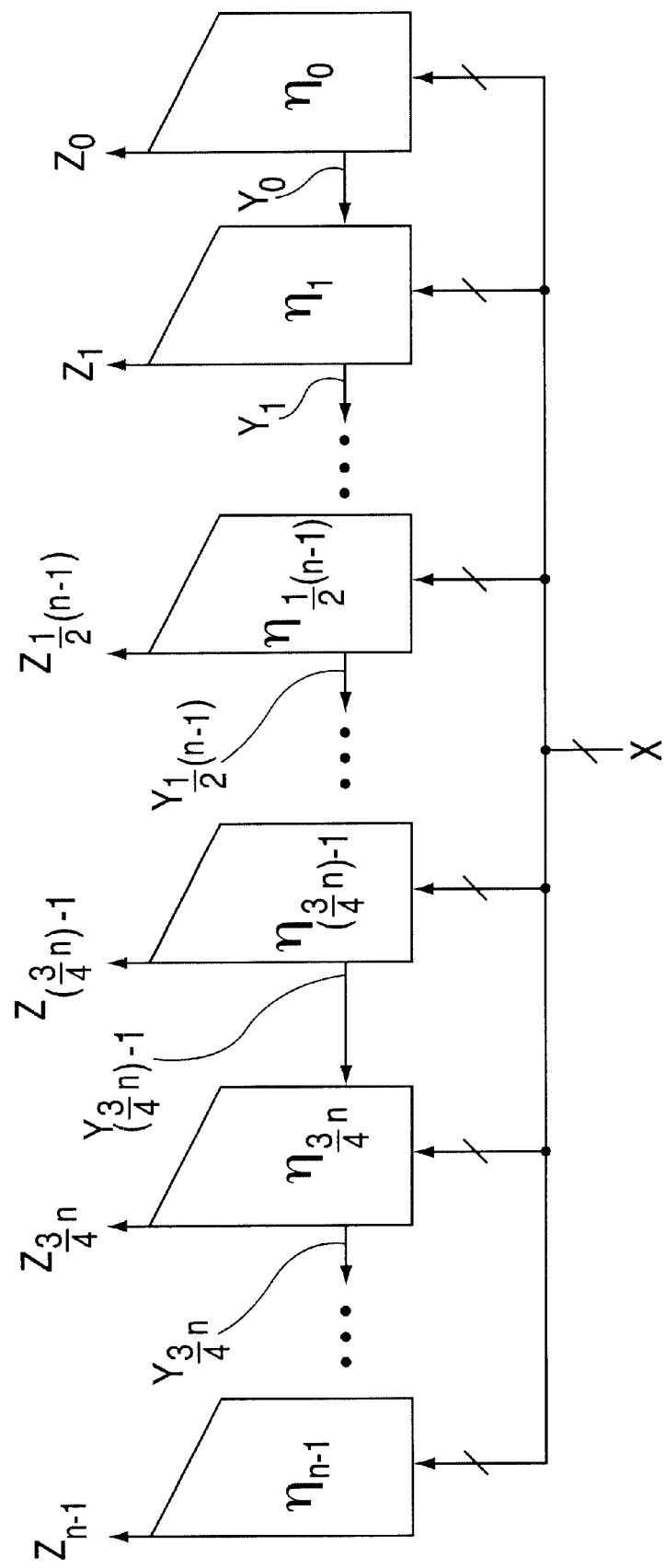
FIGS. 9A through 9D show example circuits and their operating characteristics for the present invention.
Figure 9B:
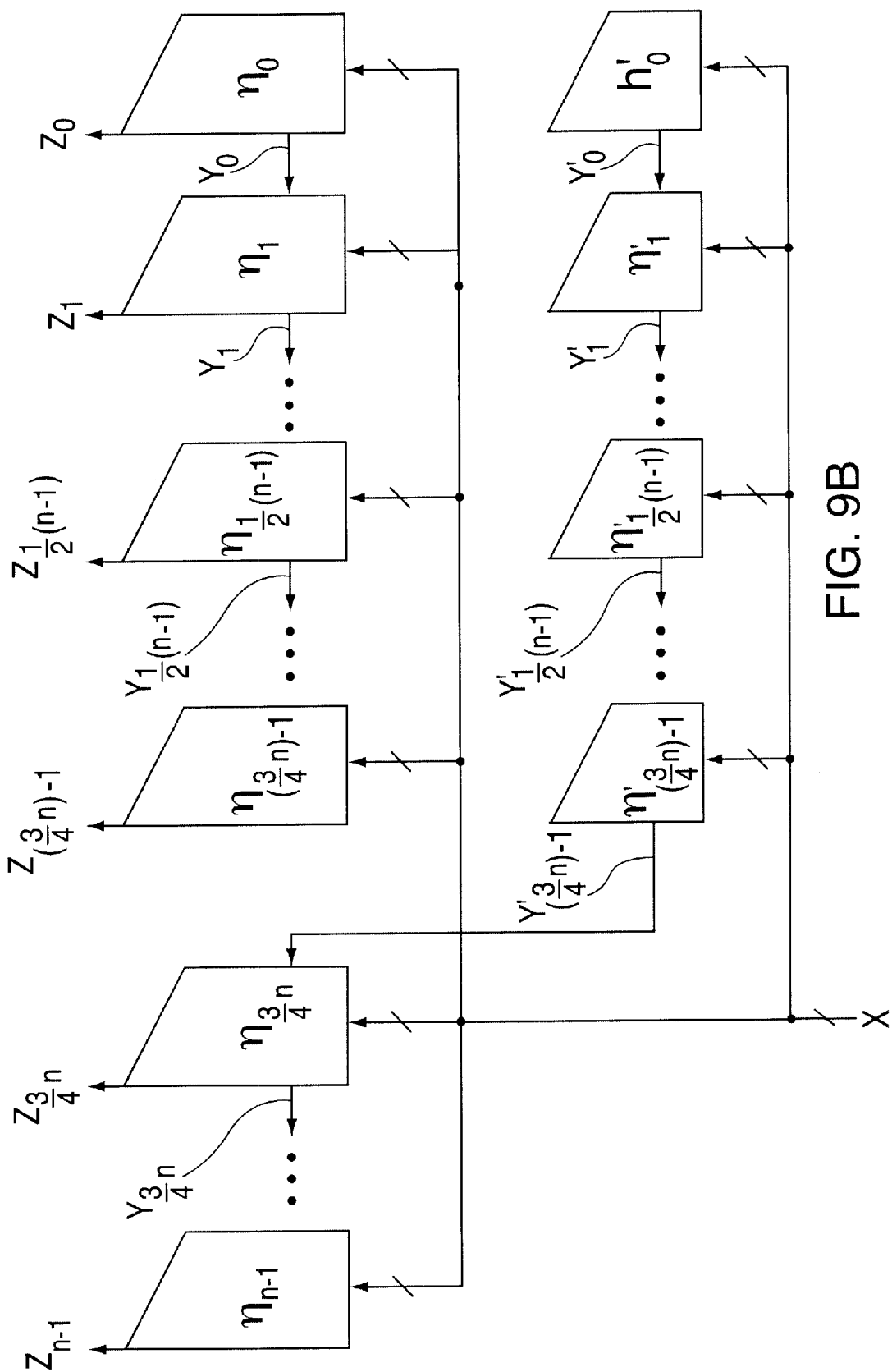
Figure 9C:
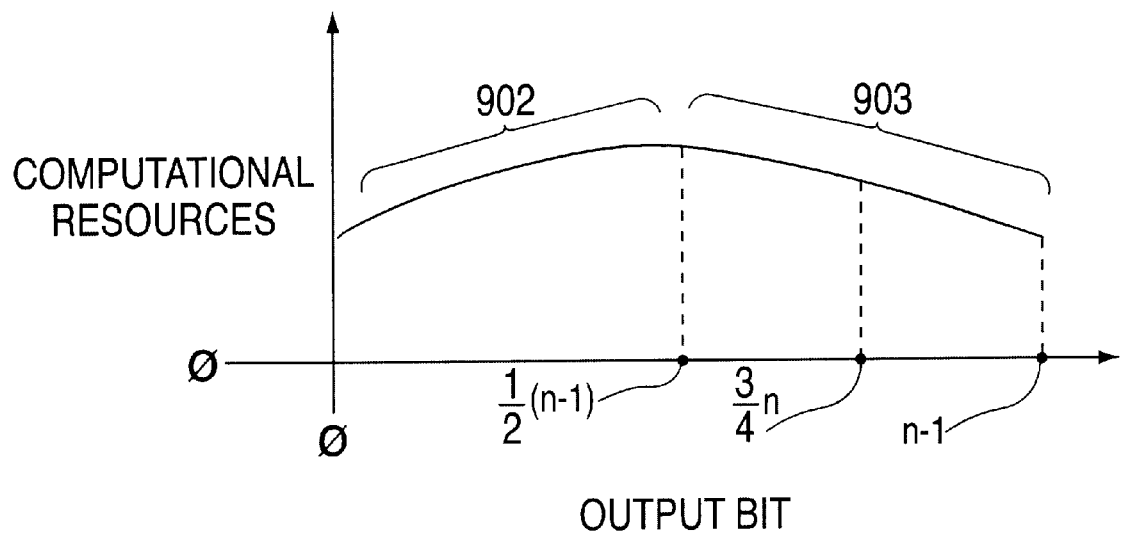
Figure 9D:
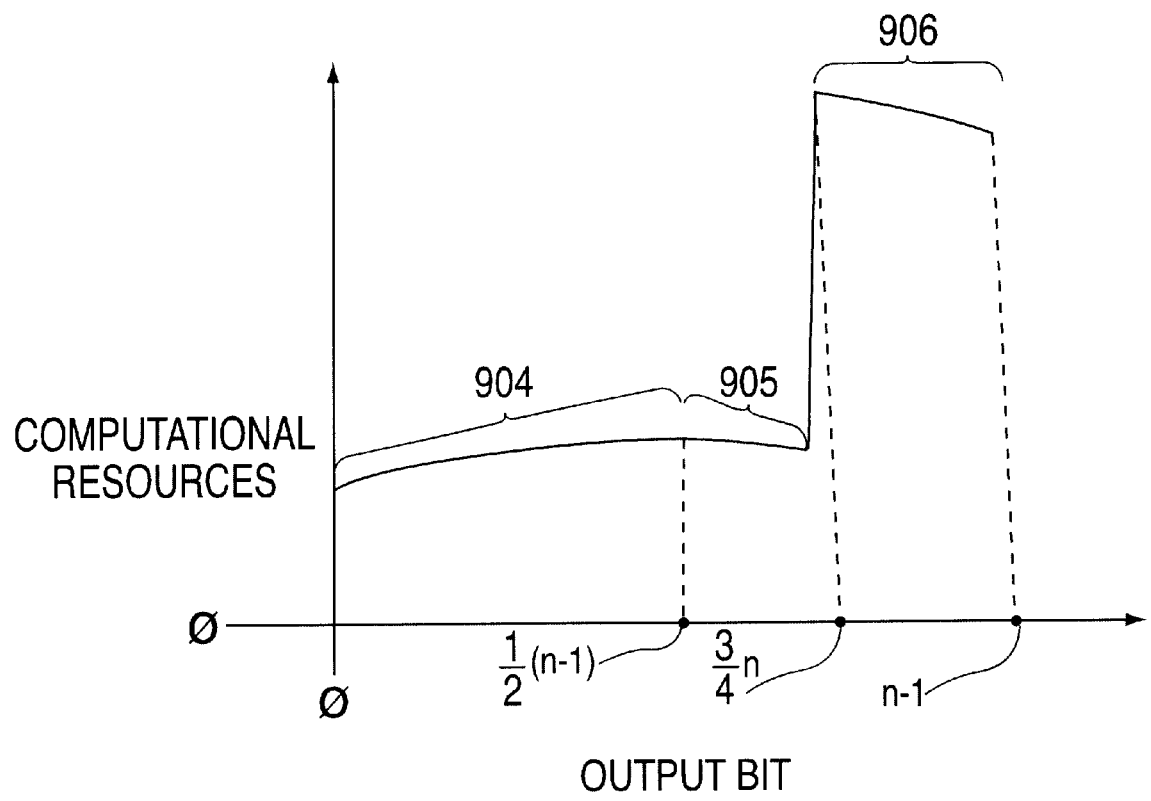

Verifying the circuit of FIG. 9A against the circuit of FIG. 9B would result in a characteristic such as that shown in FIG. 9D. FIG. 9B represents a duplication of the circuit of FIG. 9A, except for the following changes.

Subcircuit $\eta_{(¾×n)}$ is changed such that its inputs that were formerly driven by subcircuit $\eta_{(¾×n)-1}$ are now driven by a subcircuit $\eta'_{(¾×n)-1}$. Each of the subcircuits $\eta'_0$ to $\eta'_{(¾×n)-1}$ is identical to the subcircuits $\eta_0$ to $\eta_{(¾×n)-1}$ except that the output functions, that drive $z_0$ to $z_{(¾×n)-1}$ in $\eta_0$ to $\eta_{(¾×n)-1}$, have been removed. The subcircuits $\eta'_0$ to $\eta'_{(¾×n)-1}$ are connected to each other, and to the primary inputs, in an identical manner as subcircuits $\eta_0$ to $\eta_{(¾×n)-1}$.

The verification of the circuit of FIG. 9A against the circuit of FIG. 9B proceeds as follows. Starting from a low, in terms of computational resources, when verifying $z_0$ of FIG. 9A against $z_0$ of FIG. 9B, the computational resources required for verifying each succeeding pair of output bits will increase until a maximum is reached at about bit ½×(n−1). This is the segment 904 of FIG. 9D. From about output bit (½×(n−1))+1 up until output bit (¾×n)−1, the characteristic will generally decrease, in terms of computational resources required, for each successive output bit. This is segment 905 of FIG. 9D. However, at output bit (¾×n) the computational resources required greatly increases by at least several times the previous peak that occurred around output bit ½×(n−1). This is due to the fact that the partitioning of the circuit of FIG. 9B according to structural dependency will put subcircuit $\eta_{(¾×n)}$, and subcircuits $\eta'_0$ to $\eta'_{(¾×n)-1}$, into a common and very large partition. In fact, if n is large enough, it would be expected for the computational requirements to become so large such that the verification of bit (¾×n) (or of any higher-order bit) becomes intractable. This would be expected to occur, for example, where n=64. Assuming that the computational resource requirements are still tractable, from output bit (¾×n) until output bit n−1 the computational resources required generally decrease. This is depicted by segment 906 of FIG. 9D.

It should be noted in the above discussion that where n is being multiplied by a fractional value it may be necessary to round the result to the nearest integer (either upwards or downwards) in order to refer to a particular output bit for a particular circuit.

HARDWARE ENVIRONMENT

Figure 8:
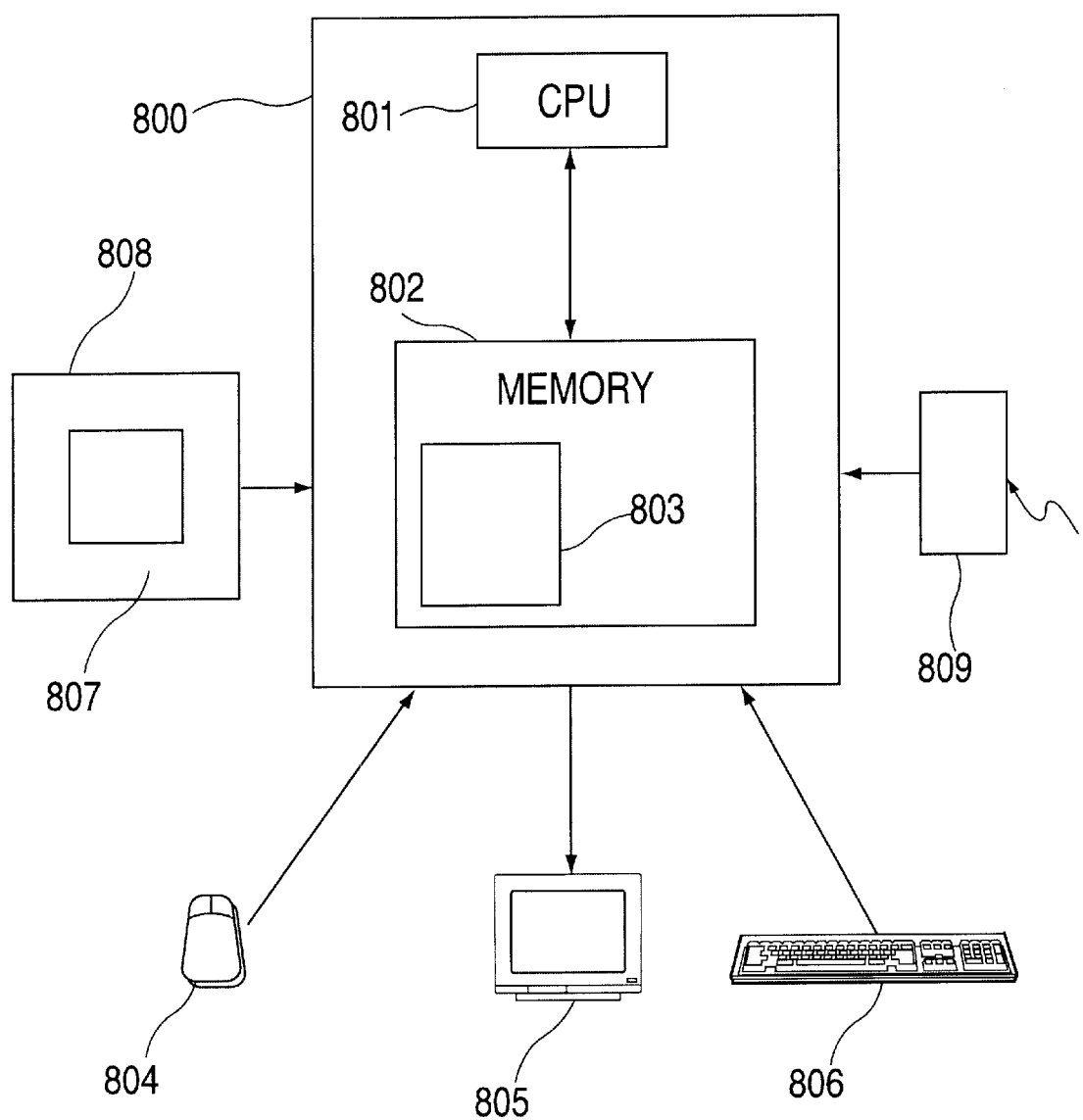
FIG. 8 depicts a hardware environment in which the present invention can be operated.

Typically, the verification architecture of the present invention is executed within the computing environment (or data processing system) such as that of FIG. 8. FIG. 8 depicts a workstation computer 800 comprising a Central Processing Unit (CPU) 801 (or other appropriate processor or processors) and a memory 802. Memory 802 has a portion of its memory in which is stored the software tools and data of the present invention. While memory 803 is depicted as a single region, those of ordinary skill in the art will appreciate that, in fact, such software may be distributed over several memory regions or several computers. Furthermore, depending upon the computer's memory organization (such as virtual memory), memory 802 may comprise several types of memory (including cache, random access memory, hard disk and networked file server). Computer 800 is typically equipped with a display monitor 805, a mouse pointing device 804 and a keyboard 806 to provide interactivity between the software of the present invention and the chip designer. Computer 800 also includes a way of reading computer readable instructions from a computer readable medium 807, via a medium reader 808, into the memory 802. Computer 800 also includes a way of reading computer readable instructions via the Internet (or other network) through network interface 809. The software tools and data of the present invention may be stored as computer readable instructions on a computer readable medium, such as 807. The software tools and data of the present invention may also be transported into a computer system over a network and through a network interface, such as 809. Such network transmission may involve the use of a carrier wave.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for circuit verification, comprising:
   partitioning a first circuit into a first number of partitions, wherein the first number of partitions of the first circuit are ordered, from a first partition to a last partition, in order of increasing structural dependence;
   partitioning a second circuit into the first number of partitions, wherein the first number of partitions of the second circuit are ordered, from a first partition to a last partition, in order of increasing structural dependence;
   selecting a consequent partition of the first circuit and a consequent partition of the second circuit;
   selecting an antecedent partition of the first circuit that is less structurally dependent than the consequent partition of the first circuit and an antecedent partition of the second circuit that is less structurally dependent than the consequent partition of the second circuit; and verifying equivalency of the consequent partition of the first circuit and the consequent partition of the second circuit by determining veracity of an implication, wherein an antecedent of the implication includes an assertion that the antecedent partition of the first circuit and the antecedent partition of the second circuit are equivalent and a consequent of the implication includes an assertion that the consequent partition of the first circuit and the consequent partition of the second circuit are equivalent.

2. The method of claim 1, wherein the antecedent partition of the first circuit is the first partition of the first circuit and the antecedent partition of the second circuit is the first partition of the second circuit.

3. The method of claim 2, wherein:
a veracity of the implication is not determined;
selecting an additional antecedent partition of the first circuit, wherein the additional antecedent partition is next most structurally dependent partition after the first partition;
selecting an additional antecedent partition of the second circuit, wherein the additional antecedent partition is next most structurally dependent partition after the first partition; and
determining veracity of the implication, wherein the antecedent of the implication is augmented to include an assertion that the additional antecedent partition of the first circuit and the additional antecedent partition of the second circuit are equivalent.

4. The method of claim 1, wherein the antecedent partition of the first circuit is a next less structurally dependant partition of the first circuit, after the consequent partition of the first circuit, and the antecedent partition of the second circuit is a next less structurally dependant partition of the second circuit, after the consequent partition of the second circuit.

5. The method of claim 4, wherein:
a veracity of the implication is not determined;
selecting an additional antecedent partition of the first circuit, wherein the additional antecedent partition is next less structurally dependent partition after the antecedent partition of the first circuit;
selecting an additional antecedent partition of the second circuit, wherein the additional antecedent partition is next less structurally dependent partition after the antecedent partition of the second circuit; and
determining veracity of the implication, wherein the antecedent of the implication is augmented to include an assertion that the additional antecedent partition of the first circuit and the additional antecedent partition of the second circuit are equivalent.

6. The method of claim 1, wherein determining the veracity of the implication includes:
forming an expression which evaluates to a true value if the antecedent of the implication evaluates to a true value and the consequent of the implication evaluates to a false value; and
determining whether the expression evaluates to a false value.

7. The method of claim 1, wherein determining the veracity of the implication includes:
forming an expression which evaluates to a true value if the antecedent of the implication evaluates to a false value or the consequent of the implication evaluates to a true value; and
determining whether the expression evaluates to a true value.

8. A system for circuit verification, comprising:
a subsystem for partitioning a first circuit into a first number of partitions, wherein the first number of partitions of the first circuit are ordered, from a first partition to a last partition, in order of increasing structural dependence;
a subsystem for partitioning a second circuit into the first number of partitions, wherein the first number of partitions of the second circuit are ordered, from a first partition to a last partition, in order of increasing structural dependence;
a subsystem for selecting a consequent partition of the first circuit and a consequent partition of the second circuit;
a subsystem for selecting an antecedent partition of the first circuit that is less structurally dependent than the consequent partition of the first circuit and an antecedent partition of the second circuit that is less structurally dependent than the consequent partition of the second circuit; and
a subsystem for verifying equivalency of the consequent partition of the first circuit and the consequent partition of the second circuit by determining veracity of an implication, wherein an antecedent of the implication includes an assertion that the antecedent partition of the first circuit and the antecedent partition of the second circuit are equivalent and a consequent of the implication includes an assertion that the consequent partition of the first circuit and the consequent partition of the second circuit are equivalent.

9. A method for circuit verification, comprising:
inputting a first circuit, wherein the first circuit is capable of being partitioned into a first number of partitions, wherein the first number of partitions of the first circuit are capable of being ordered, from a first partition to a last partition, in order of increasing structural dependence;
inputting a second circuit, wherein the second circuit has a structure that is capable of being formed as follows:
  i) copying the first circuit to produce a first subsection of the second circuit;
  ii) copying the first circuit to produce a second subsection of the second circuit, wherein the copying is performed from the first partition to a three-quarter-minus-one partition, wherein the three-quarter-minus-one partition is located, between the first and the last partition, at a bit location indicated by multiplying the first number of partitions by the fraction three-quarters and subtracting one;
  iii) removing the primary output functions of the second subsection;
  iv) identifying a three-quarter partition of the first subsection, wherein the three-quarter partition is located, between the first and the last partition, at a bit location corresponding to a one plus a bit location of the three-quarter-minus-one partition; and
  v) altering the three-quarter partition of the first subsection such that its non-primary inputs are driven by the corresponding non-primary outputs of the three-quarter-minus-one partition of the second subsection;
verifying primary output bit by primary output bit from a first bit position of the first and second circuits to a bit position one before a three-quarter bit position of the first and second circuits utilizing computational resources, for any pair of bit positions, that is no greater than a first maximum value, wherein the three-quarter bit position is a bit position in the first and second circuits whose determination includes multiplying the first number of partitions by the fraction three-quarters; and verifying the three-quarter bit position of the first circuit against the three-quarter bit position of the second circuit utilizing computational resources at least twice as great as the first maximum value.

10. A method for circuit verification, comprising:

inputting a first circuit, wherein the first circuit is capable of being partitioned into a first number of partitions, wherein the first number of partitions of the first circuit are capable of being ordered, from a first partition to a last partition, in order of increasing structural dependence;

inputting a second circuit, wherein the second circuit is capable of being partitioned into the same first number of partitions, wherein the first number of partitions of the second circuit are capable of being ordered, from a first partition to a last partition, in order of increasing structural dependence;

verifying primary output bit by primary output bit from a first bit position of the first and second circuits to halfway bit positions of the first and second circuits utilizing computational resources that generally increase for each successive primary output bit until the halfway bit positions are reached, wherein the halfway bit positions at a same bit position whose determination includes multiplying the first number of partitions by the fraction one-half.

11. The method for circuit verification of claim 10, further comprising:

verifying primary output bit by primary output bit from the halfway bit positions of the first and second circuits to a last bit position of the first and second circuits utilizing computational resources that generally decrease for each successive bit.

12. A computer program product comprising:

a computer usable medium having computer readable code embodied therein for causing circuit verification, the computer program product including:

computer readable program code devices configured to cause a computer to effect partitioning a first circuit into a first number of partitions, wherein the first number of partitions of the first circuit are ordered, from a first partition to a last partition, in order of increasing structural dependence;

computer readable program code devices configured to cause a computer to effect partitioning a second circuit into the first number of partitions, wherein the first number of partitions of the second circuit are ordered, from a first partition to a last partition, in order of increasing structural dependence;

computer readable program code devices configured to cause a computer to effect selecting a consequent partition of the first circuit and a consequent partition of the second circuit;

computer readable program code devices configured to cause a computer to effect selecting an antecedent partition of the first circuit that is less structurally dependent than the consequent partition of the first circuit and an antecedent partition of the second circuit that is less structurally dependent than the consequent partition of the second circuit; and computer readable program code devices configured to cause a computer to effect verifying equivalency of the consequent partition of the first circuit and the consequent partition of the second circuit by determining veracity of an implication, wherein an antecedent of the implication includes an assertion that the antecedent partition of the first circuit and the antecedent partition of the second circuit are equivalent and a consequent of the implication includes an assertion that the consequent partition of the first circuit and the consequent partition of the second circuit are equivalent.

13. An electronic data signal representing sequences of instructions which, when executed by a data processing system, cause circuit verification by performing the steps of:

partitioning a first circuit into a first number of partitions, wherein the first number of partitions of the first circuit are ordered, from a first partition to a last partition, in order of increasing structural dependence;

partitioning a second circuit into the first number of partitions, wherein the first number of partitions of the second circuit are ordered, from a first partition to a last partition, in order of increasing structural dependence;

selecting a consequent partition of the first circuit and a consequent partition of the second circuit;

selecting an antecedent partition of the first circuit that is less structurally dependent than the consequent partition of the first circuit and an antecedent partition of the second circuit that is less structurally dependent than the consequent partition of the second circuit; and verifying equivalency of the consequent partition of the first circuit and the consequent partition of the second circuit by determining veracity of an implication, wherein an antecedent of the implication includes an assertion that the antecedent partition of the first circuit and the antecedent partition of the second circuit are equivalent and a consequent of the implication includes an assertion that the consequent partition of the first circuit and the consequent partition of the second circuit are equivalent.

* * * * *